(12) United States Patent
Park et al.

(10) Patent No.: US 7,129,632 B2
(45) Date of Patent: Oct. 31, 2006

(54) ORGANIC ELECTROLUMINESCENT DEVICE AND METHOD OF FABRICATING THE SAME

(75) Inventors: Jae-Yong Park, Gyeonggi-do (KR); Choong-Keun Yoo, Incheon-si (KR); Hee-Suk Pang, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 69 days.

(21) Appl. No.: 10/224,395

(22) Filed: Aug. 21, 2002

(65) Prior Publication Data
US 2003/0042848 A1  Mar. 6, 2003

(30) Foreign Application Priority Data
Aug. 29, 2001 (KR) ................. 2001-52309

(51) Int. Cl.
*H05B 33/00* (2006.01)
(52) U.S. Cl. ........................... 313/503; 313/506
(58) Field of Classification Search ............ 315/169.1, 315/169.3; 313/504–506, 503; 428/690
See application file for complete search history.

(56) References Cited

U.S. PATENT DOCUMENTS

| | | | |
|---|---|---|---|
| 5,776,622 A * | 7/1998 | Hung et al. | 428/690 |
| 5,977,704 A * | 11/1999 | Shi et al. | 313/504 |
| 6,285,039 B1 * | 9/2001 | Kobori et al. | 313/504 |
| 6,310,360 B1 * | 10/2001 | Forrest et al. | 257/40 |
| 6,312,836 B1 * | 11/2001 | Bulovic et al. | 313/504 |
| 6,384,529 B1 * | 5/2002 | Tang et al. | 313/506 |
| 6,538,390 B1 * | 3/2003 | Fujita et al. | 315/169.3 |
| 6,864,628 B1 | 3/2005 | Yamazaki et al. | |
| 2003/0017361 A1 * | 1/2003 | Thompson et al. | 313/506 |

FOREIGN PATENT DOCUMENTS

WO      WO 00/70917      11/2000

\* cited by examiner

*Primary Examiner*—Joseph Williams
(74) *Attorney, Agent, or Firm*—Morgan, Lewis & Bockius, LLP (57) ABSTRACT

An organic electroluminescent display device includes a substrate having a plurality of sub-pixel regions for red, green and blue, a driving device on the substrate, a first electrode connected to the driving device, a hole being injected from the first electrode, a second electrode over the first electrode, an electron being injected from the second electrode, and a light emitting material layer interposed between the first and second electrodes, the light emitting material layer of at least one of the plurality of sub-pixel regions includes a phosphorescent material.

27 Claims, 6 Drawing Sheets

ORGANIC ELECTROLUMINESCENT DEVICE AND METHOD OF FABRICATING THE SAME

The present invention claims the benefit of the Korean Patent Application No. P2001-52309 filed in Korea on Aug. 29, 2001, which is hereby incorporated by reference.

BACKGROUND OF THE INVENTION

1. Field of the Invention

The present invention relates to an organic electroluminescent display (ELD), and more particularly, to an organic ELD with high color purity with low driving current.

2. Discussion of the Related Art

Generally, organic ELD's use organic materials having high fluorescent or phosphorescent efficiency. Accordingly, band gaps of the organic materials may be easily developed through molecule design and synthesis. Moreover, organic ELDs can be fabricated on glass and plastic substrates because of their low fabricating temperatures.

Figure 1:
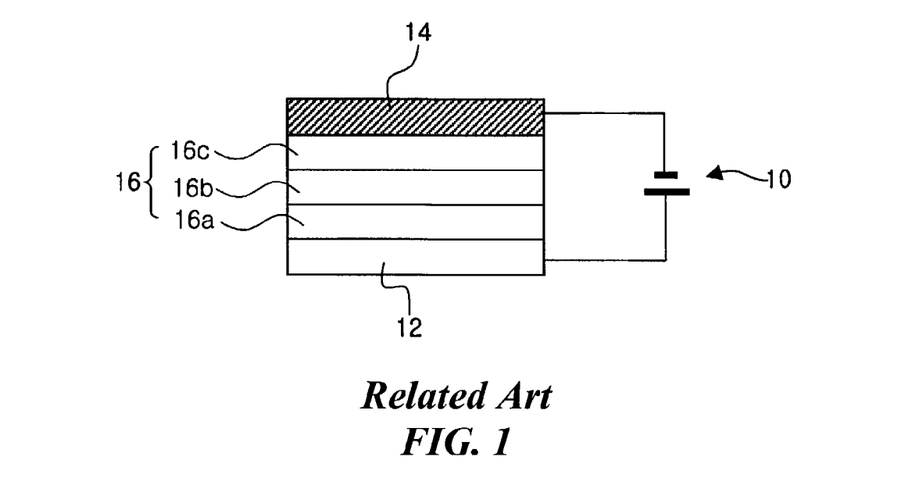
FIG. 1 is a cross-sectional view of an organic ELD according to the related art.

FIG. 1 is a cross-sectional view of an organic ELD according to the related art. In FIG. 1, an organic ELD 10 includes a first electrode 12, a second electrode 14, and an organic layer 16 interposed therebetween. Electrons and holes are injected through the first and second electrodes 12 and 14, respectively. The organic layer 16 is composed of a hole transporting layer (HTL) 16a contacting the first electrode 12, an electron transporting layer (ETL) 16c contacting the second electrode 14, and an emitting material layer (EML) 16b interposed between the HTL 16a and the ETL 16c. The EML 16b is a electroluminescent organic layer that emits light by application of an electric field.

In the ELD, the electron and the hole injected through the first and second electrodes 12 and 14 combine into an exciton. When the exciton falls from an excited state to a ground state, light is emitted. Further, a ratio of "photons-out" per "charge-injected" increases, and a driving voltage decreases due to the HTL 16a and the ETL 16c. Since carriers are injected through a two step injection process using a transporting layer, the driving voltage may be reduced. Moreover, when the electron and the hole are injected into the EML 16b and move to an opposite electrode, a recombination may be adjusted since the electron and the hole are blocked by an opposite transporting layer. Accordingly, luminescent efficiency increases.

For a display device, the organic ELD 10 is formed on a large area substrate having a plurality of pixel regions that are composed of sub-pixel regions of red (R), green (G), and blue (B). Moreover, different organic materials are used within each sub-pixel region in order to display different colors.

Figure 2:
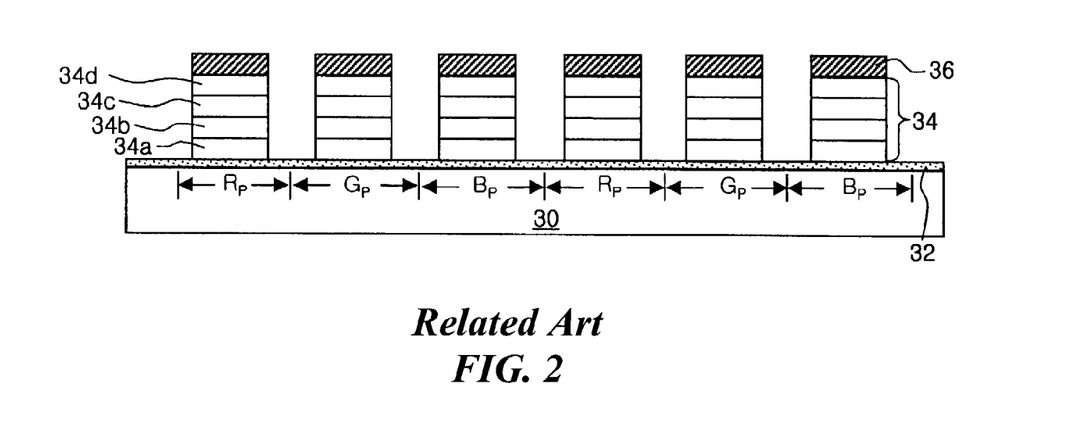
FIG. 2 is a cross-sectional view of a full color organic ELD according to the related art.

FIG. 2 is a cross-sectional view of a full color organic ELD according to the related art. In FIG. 2, a passive matrix organic ELD includes a first electrode 32 formed on a substrate 30 along a first direction and a multi-layered organic layer 34 formed on the first electrode 32. A second electrode 36 is formed on the multi-layered organic layer 34 along a second direction crossing the first electrode 32, thereby defining pixel regions $R_P$, $G_P$ and $B_P$. The multi-layered organic layer 34 is composed of a hole induced layer (HIL) 34a, a HTL 34b, an EML 34c and an ETL 34d. The multi-layered organic layer 34 and the second electrode 36 are formed to extend along the second direction at each of the pixel regions $R_P$, $G_P$ and $B_P$. For the full color organic ELD, a different EML 34c is formed at each of the pixel regions $R_P$, $G_P$ and $B_P$.

Figure 3:
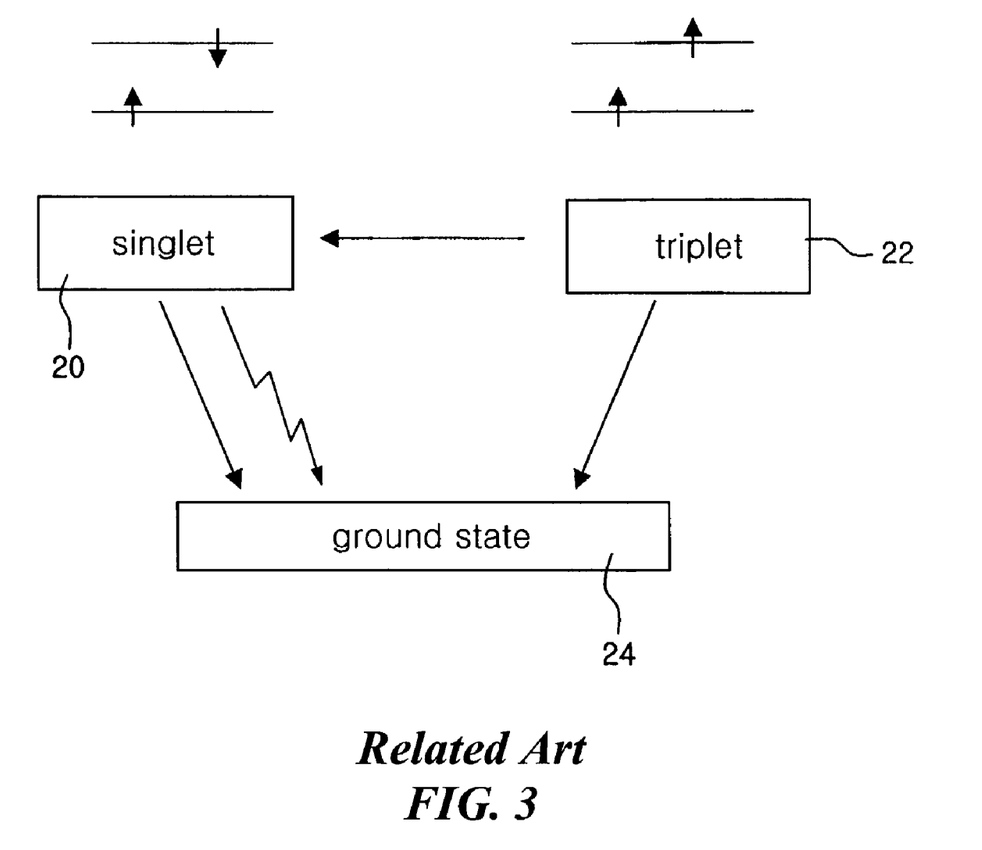
FIG. 3 is a diagram showing an energy status of emitting material according to the related art.

FIG. 3 is a diagram showing an energy status of emitting material according to the related art. In FIG. 3, light is emitted when an exciton, which is generated by combination of an electron-hole pair individually injected from first and second electrodes, falls to a ground state. When the electron-hole pair have a spin (S) of S=½ combine into the exciton, a singlet exciton 20 having a spin of S=0 and a triplet exciton 22 having a spin of S=1 are generated with a ratio of 1 to 3. In the singlet exciton 20, two spins are inversely symmetric and in the triplet exciton 22, the two spins are symmetric. Even though the triplet exciton 22 has a lower energy than the singlet exciton 20 due to mutual interaction, a transition from the singlet exciton 20 to the triplet exciton 22 is basically prohibited because of spin changes. However, singlet exciton 20 can be substantially transitioned to the triplet exciton 22 due to spin-orbit coupling.

Since a ground state 24 of organic molecules is a singlet, a transition from the triplet exciton 22 to the ground state 24 of the singlet with emitting light is prohibited. Conversely, the singlet exciton 20 is transitioned to the ground state 24 of a singlet with fluorescence. However, the triplet exciton 22 can be substantially transited to the ground state 24 of a singlet with phosphorescence due to a perturbation, such as a spin-orbit coupling. Accordingly, in an ELD using fluorescent material, a triplet exciton does not contribute to total luminescence, whereas only a singlet exciton can contribute to the total luminescence. As a result, phosphorescent material using a triplet exciton is more energy efficient and has a longer material lifetime.

Conventional organic ELD's commonly use fluorescent material as an EML. However, the fluorescent material EML does not have sufficient luminescent efficiency. Specifically, since organic materials for R, G and B have different luminescent efficiencies, the EML of one color has lower luminescent efficiency than the EML of the other colors when driven with same current. Therefore, luminescent efficiency of an EML increases by raising a driving current for the EML so that adequate white purity of a full color organic ELD can be obtained. However, due to a high driving current, high power consumption is problematic.

SUMMARY OF THE INVENTION

Accordingly, the present invention is directed to an organic electroluminescent display and a method of fabricating an organic electroluminescent display that substantially obviates one or more of problems due to limitations and disadvantages of the related art.

An object of the present invention is to provide a full color organic electroluminescent display using a phosphorescent material for at least one color of low luminescent efficiency and a fluorescent material for the other colors.

Another object of the present invention is provide a method of fabricating a full color organic electroluminescent display using a phosphorescent material for at least one color of low luminescent efficiency and a fluorescent material for the other colors.

Another object of the present invention is to provide a full color organic electroluminescent display of wide area having low power consumption.

Another object of the present invention is to provide a method of fabricating a full color organic electroluminescent display of wide area having low power consumption.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes a substrate having a plurality of sub-pixel regions for red, green and blue, a driving device on the substrate, a first electrode connected to the driving device, a hole being injected from the first electrode, a second electrode over the first electrode, an electron being injected form the second electrode, and a light emitting material layer interposed between the first and second electrodes, the light emitting material layer of at least one of the plurality of sub-pixel regions includes a phosphorescent material.

In another aspect, an organic electroluminescent display device includes a substrate, a first electrode disposed along a first direction on the substrate, a hole being injected from the first electrode, a second electrode disposed along a second direction perpendicular to the first direction over the first electrode, an electron being injected from the second electrode, a plurality of sub-pixel regions for red, green and blue disposed at intersections of the first and second electrodes, and a light emitting material layer interposed between the first and second electrodes, the light emitting material layer of at least one sub-pixel region includes a phosphorescent material.

In another aspect, a method of fabricating an organic electroluminescent display device includes forming a plurality of sub-pixel regions for red, green and blue on a substrate, forming a driving device on the substrate, forming a first electrode connected to the driving device, a hole being injected from the first electrode, forming a second electrode over the first electrode, an electron being injected from the second electrode, and forming a light emitting material layer interposed between the first and second electrodes, the light emitting material layer of at least one of the plurality of sub-pixel regions includes a phosphorescent material.

In another aspect, a method of fabricating an organic electroluminescent display device includes forming a first electrode disposed along a first direction on a substrate, a hole being injected from the first electrode, forming a second electrode disposed along a second direction perpendicular to the first direction over the first electrode, an electron being injected from the second electrode, forming a plurality of sub-pixel regions for red, green and blue disposed at intersections of the first and second electrodes, and forming a light emitting material layer interposed between the first and second electrodes, the light emitting material layer of at least one sub-pixel region includes a phosphorescent material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 4:
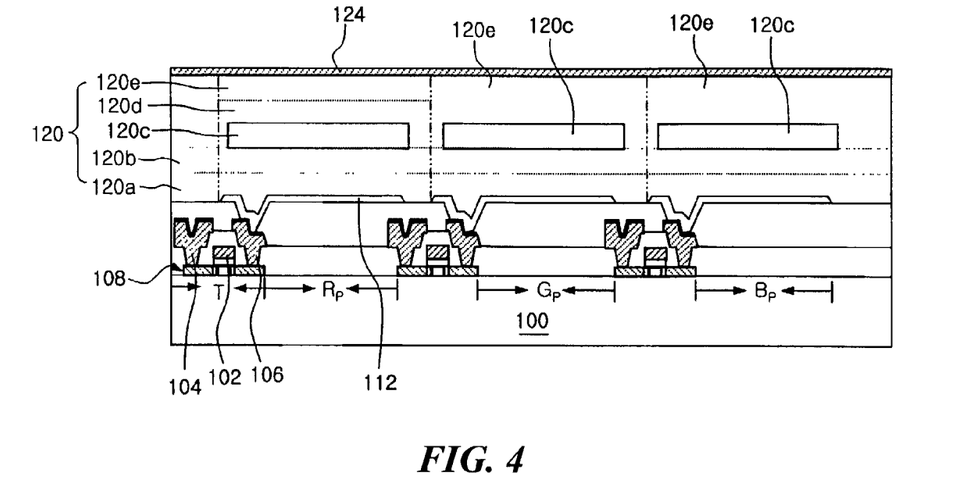
FIG. 4 is a cross-sectional view of an exemplary ELD according to the present invention.

FIG. 4 is a cross-sectional view of an exemplary ELD according to the present invention. In FIG. 4, a driving device "T" may be formed on a substrate 100 including a pixel region (not shown). The pixel region may include a plurality of sub-pixel regions $R_P$ for red (R), $G_P$ for green (G), and $B_P$ for blue (B). The driving device "T" may drive a first electrode 112 in response to a signal received from a switching device (not shown) adjacent to the plurality of sub-pixel regions $R_P$, $G_P$, and $B_P$. A thin film transistor (TFT) including a gate electrode 102, an active layer 108, and source and drain electrodes 104 and 106 may be used as the driving device "T" and the switching device (not shown). A storage capacitor (not shown) connected to the driving device "T" and the switching device may also be formed adjacent to the plurality of sub-pixel regions $R_P$, $G_P$, and $B_P$.

The first electrode 112 may be formed at each sub-pixel region and a second electrode 124 may be formed over the first electrode 112. An organic layer 120 of multi-layers may be interposed between the first and second electrodes 112 and 124. The first electrode 112 may include a transparent conductive material having a high work function, such as indium-tin-oxide (ITO) or indium-zinc-oxide (IZO), for example, and the second electrode 124 may include a metallic material having a low work function, such as aluminum (Al), calcium (Ca) or magnesium (Mg), for example. Alternatively, the second electrode 124 may include a double layer structure including lithium fluorine/aluminum (LiF/Al), for example. The first electrode 112 may function as an anode through which a hole is injected into the organic layer 120, wherein the first electrode 112 may be electrically connected to the drain electrode 106. The second electrode 124 may function as a cathode through which an electron is injected into the organic layer 120, wherein the second electrode 124 may be electrically connected to a common electrode (not shown) disposed over the substrate 100. The switching device (not shown) may be electrically connected to a gate line (not shown) and a data line (not shown).

The organic layer 120 may include a hole injection layer (HIL) 120a, a hole transporting layer (HTL) 120b, an emitting material layer (EML) 120c, and an electron transporting layer (ETL) 120e. The HIL 120a may function as a buffer layer to lower an energy barrier between the HIL 120a and the first electrode 112 in order to smoothly inject a hole from the first electrode 112 into the HTL 120b. The EML 120c disposed at the red sub-pixel region $R_P$ may be formed of a phosphorescent material. Since the phosphorescent material has a high luminescent efficiency even with a low driving voltage, red images may be displayed with a high red purity. The EML 120c disposed at the green and blue sub-pixel regions $G_P$ and $B_P$ may be formed of a fluorescent material. Further, a hole blocking layer (HBL) 120d may be formed on the EML 120c of the phosphorescent material. Since a triplet luminescent material has a different energy band from a singlet luminescent material, the triplet material has a lower recombination probability of an electron-hole pair than the singlet luminescent material. To raise the recombination probability of an electron-hole pair, the hole should remain within the EML 120c for a increased amount of time. Accordingly, the HBL 120d maintains the hole within the EML 120c for the increased amount of time. Even though a phosphorescent material is used for red in the present invention, the phosphorescent material can be used for green or blue.

Figure 5:
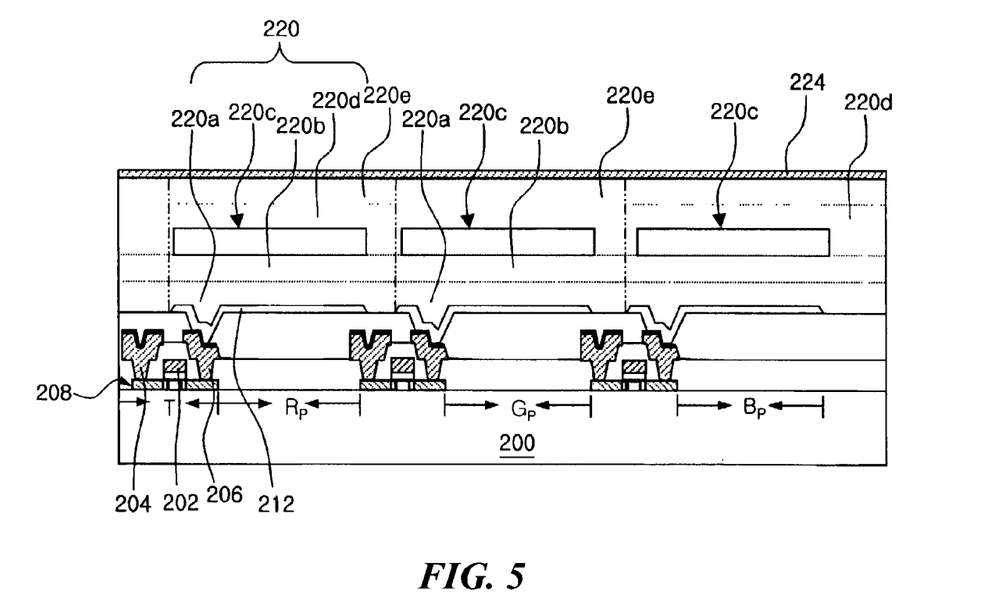
FIG. 5 is a cross-sectional view of another exemplary ELD according to the present invention.

FIG. 5 is a cross-sectional view of another exemplary ELD according to the present invention. In FIG. 5, a driving device "T" may be formed on a substrate 200 having a pixel region (not shown). The pixel region may include a plurality of sub-pixel regions $R_P$ for red (R), $G_P$ for green (G), and $B_P$ for blue (B). The driving device "T" may drive a first electrode 212 in response to a signal received from a switching device (not shown) adjacent to the plurality of sub-pixel regions $R_P$, $G_P$, and $B_P$. A thin film transistor (TFT) including a gate electrode 202, an active layer 208, and source and drain electrodes 204 and 206 may be used as the driving device "T" and the switching device (not shown). A storage capacitor (not shown) connected to the driving device "T" and the switching device may also be formed adjacent to the plurality of sub-pixel regions $R_P$, $G_P$, and $B_P$.

The first electrode 212 may be formed at each sub-pixel region and a second electrode 224 may be formed over the first electrode 212. An organic layer 220 of multi-layers may be interposed between the first and second electrodes 212 and 224. The first electrode 212 may include a transparent conductive material having a high work function, such as indium-tin-oxide (ITO) or indium-zinc-oxide (IZO), for example, and the second electrode 224 may include a metallic material having a low work function, such as aluminum (Al), calcium (Ca) or magnesium (Mg), for example. Alternatively, the second electrode 224 may include a double layer structure including lithium fluorine/aluminum (LiF/Al), for example. The first electrode 212 may function as an anode through which a hole is injected into the organic layer 220, wherein the first electrode 212 may be electrically connected to the drain electrode 206. The second electrode 224 may function as a cathode through which an electron is injected into the organic layer 220, wherein the second electrode 224 may be electrically connected to a common electrode (not shown) over the substrate 200. The switching device (not shown) may be connected to a gate line (not shown) and a data line (not shown).

The organic layer 220 for red and blue may include a hole injection layer (HIL) 220a, a hole transporting layer (HTL) 220b, an emitting material layer (EML) 220c of a phosphorescent material, a hole blocking layer (HBL) 220d, and an electron transporting layer (ETL) 220e. Conversely, the organic layer 220 for green having the EML 220c of a fluorescent material may not include the HBL 220d. Even though a phosphorescent material may be used for red and blue in the present invention, the phosphorescent material may be used for the other set of two colors.

Figure 6A:
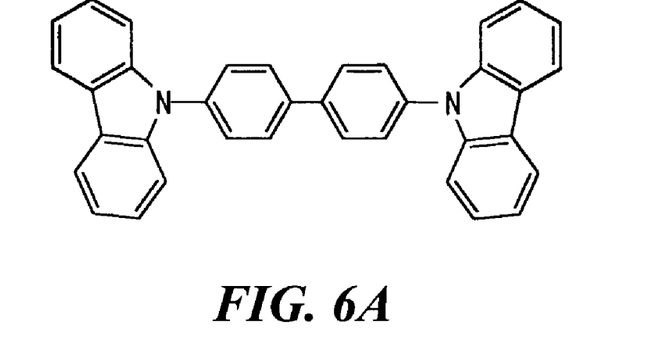
FIGS. 6A, 6B, and 6C are diagrams showing exemplary chemical compositions of CBP, Ir(ppy)$_3$ and PtOEP, respectively, according to the present invention.
Figure 6B:
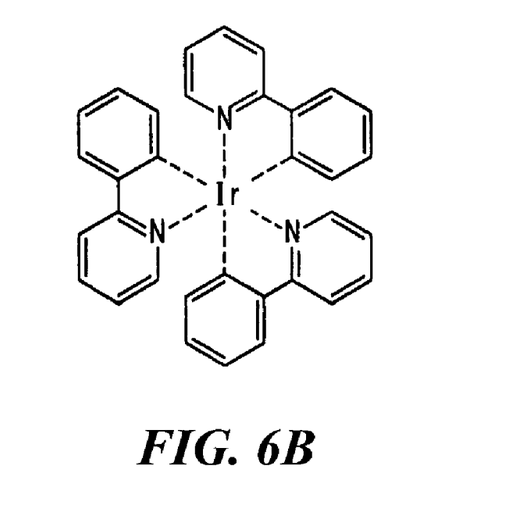
Figure 6C:
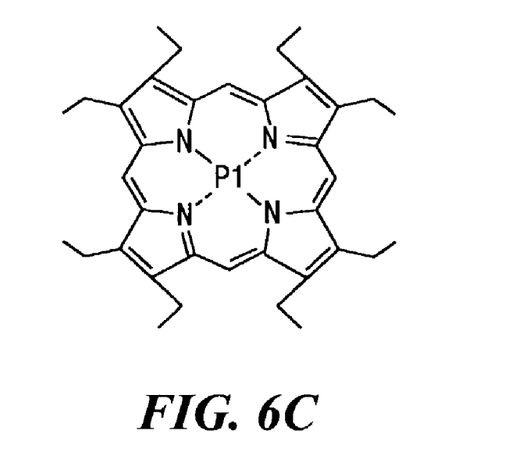

The HIL 220a and the HTL 220b may be independently formed for each sub-pixel region $R_P$, $G_P$, and $B_P$ to maximize a luminescent efficiency of the EML 220c. For example, when the phosphorescent material used for the EML 220c is CBP(4,49-N,N9-dicarbazole-biphenyl), BCP and BAlq$_3$ can be used as the HBL 220d. Moreover, Ir(ppy)$_3$ and PtOEP(2,3,7,8,12,13,17,18-octaethyl-21H,23H-porphine platinum(II)) may be used as a dopant for green and red, respectively, as shown in FIGS. 6A, 6B, and 6C. Here, the same material may be used for the ETL 220e of each sub-pixel region $R_P$, $G_P$, and $B_P$.

Figure 7:
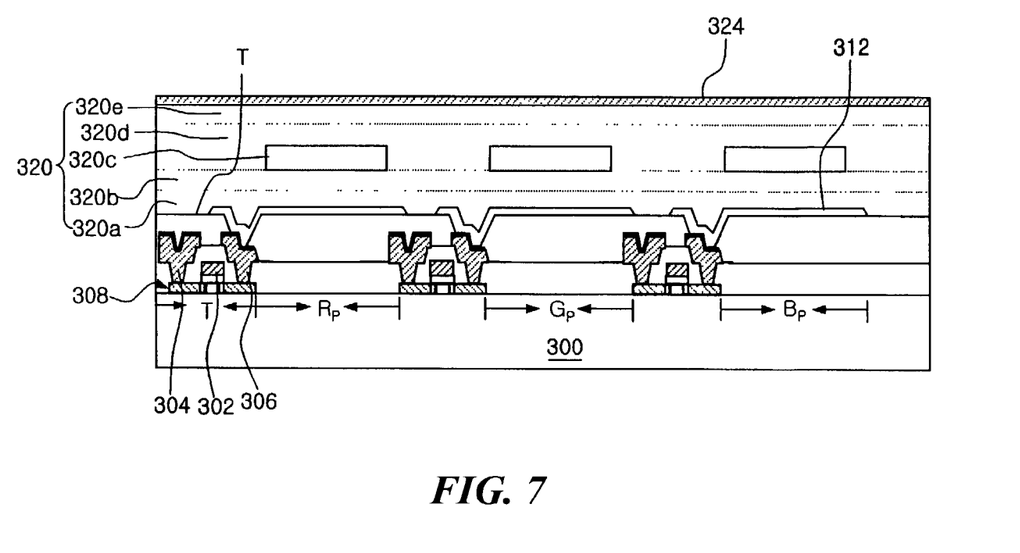
FIG. 7 is a cross-sectional view of another exemplary ELD according to the present invention.

FIG. 7 is a cross-sectional view of another exemplary ELD according to the present invention. In FIG. 7, a driving device "T" may be formed on a substrate 300 having a pixel region (not shown). The pixel region may include a plurality of sub-pixel regions $R_P$ for red (R), $G_P$ for green (G), and $B_P$ for blue (B). The driving device "T" may drive a first electrode 312 in response to a signal received from a switching device (not shown) adjacent to the plurality of sub-pixel regions $R_P$, $G_P$, and $B_P$. A thin film transistor (TFT) including a gate electrode 302, an active layer 308, and source and drain electrodes 304 and 306 may be used as the driving device "T" and the switching device (not shown). A storage capacitor (not shown) connected to the driving device "T" and the switching device may also be formed adjacent to the plurality of sub-pixel regions $R_P$, $G_P$, and $B_P$.

The first electrode 312 may be formed at each sub-pixel region and a second electrode 324 may be formed over the first electrode 312. An organic layer 320 of multi-layers may be interposed between the first and second electrodes 312 and 324. The first electrode 312 may include a transparent conductive material having a high work function, such as indium-tin-oxide (ITO) or indium-zinc-oxide (IZO), for example, and the second electrode 324 may include a metallic material having a low work function, such as aluminum (Al), calcium (Ca) or magnesium (Mg), for example. Alternatively, the second electrode 324 may include a double layer structure including lithium fluorine/aluminum (LiF/Al), for example. The first electrode 312 may function as an anode through which a hole is injected into the organic layer 320, wherein the first electrode 312 may be electrically connected to the drain electrode 306. The second electrode 322 may function as a cathode through which an electron is injected into the organic layer 320, wherein the second electrode 322 may be electrically connected to a common electrode (not shown) over the substrate 300. The switching device (not shown) may be electrically connected to a gate line (not shown) and a data line (not shown).

The organic layer 320 for red, green and blue may include a hole injection layer (HIL) 320a, a hole transporting layer (HTL) 320b, an emitting material layer (EML) 320c, a hole blocking layer (HBL) 320d, and an electron transporting layer (ETL) 320e. The EML 320c may be independently formed at each sub-pixel region $R_P$, $G_P$, and $B_P$ through deposition and patterning of a phosphorescent material, for example.

Even though FIGS. 4, 5, and 7 show an organic ELD of active matrix type using a driving device and a switching device, the present invention may be applied to an organic ELD of passive matrix type.

Figure 8:
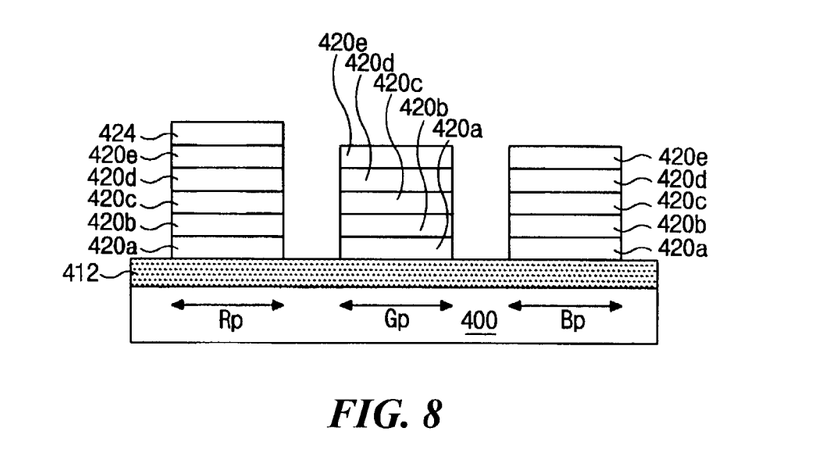
FIG. 8 is a cross-sectional view of another exemplary ELD according to the present invention.

FIG. 8 is a cross-sectional view of another exemplary ELD according to the present invention. In FIG. 8, a first electrode 412 may be formed on a substrate 400 having a pixel region (not shown) along a first direction. The pixel region may include a plurality of sub-pixel regions $R_P$ for red (R), $G_P$ for green (G), and $B_P$ for blue (B). A second electrode 424 may be formed over the first electrode 412 along a second direction perpendicular to the first direction to cross the first electrode 412. The plurality of sub-pixel regions $R_P$, $G_P$, and $B_P$ may be disposed at crossing portions of the first and second electrodes 412 and 424. An organic layer 420 of multi-layers may be interposed between the first and second electrodes 412 and 424. The first electrode 412 may include a transparent conductive material having a high work function, such as indium-tin-oxide (ITO) or indium-zinc-oxide (IZO), for example, and the second electrode 424 may include a metallic material having a low work function, such as aluminum (Al), calcium (Ca) or magnesium (Mg), for example. Alternatively, the second electrode 424 may include a double layer structure including lithium fluorine/aluminum (LiF/Al), for example. The first electrode 412 may function as an anode through which a hole is injected into the organic layer 420, wherein the first electrode 412 may be electrically connected to an external circuit (not shown). The second electrode 424 may function as a cathode through which an electron is injected into the organic layer 420, wherein the second electrode 424 may also be electrically connected to the external circuit (not shown).

The organic layer 420 may include a hole injection layer (HIL) 420a, a hole transporting layer (HTL) 420b, an emitting material layer (EML) 420c, and an electron transporting layer (ETL) 420e. The HIL 420a may function as a buffer layer to lower an energy barrier between the HIL 420a and the first electrode 412 in order to smoothly inject a hole from the first electrode 412 into the HTL 420b. The EML 420c disposed at the red sub-pixel region $R_P$ may be formed of a phosphorescent material. Since the phosphorescent material has a high luminescent efficiency even with a low driving voltage, red images may be displayed with a high red purity. The EML 420c at the green and blue sub-pixel regions $G_P$ and $B_P$ may be formed of a fluorescent material. Further, a hole blocking layer (HBL) 420d may be formed on the EML 420c of the phosphorescent material at the red sub-pixel region $R_P$. Since a triplet luminescent material has a different energy band from a singlet luminescent material, the triplet material has a lower recombination probability of an electron-hole pair than the singlet luminescent material. To raise the recombination probability of an electron-hole pair, the hole should stay within the EML 420c for an increased amount of time. The HBL 420d maintains the hole within the EML 420c for the increased amount of time. Even though a phosphorescent material may be used for red in the present invention, the phosphorescent material may be used for green or blue.

Figure 9:
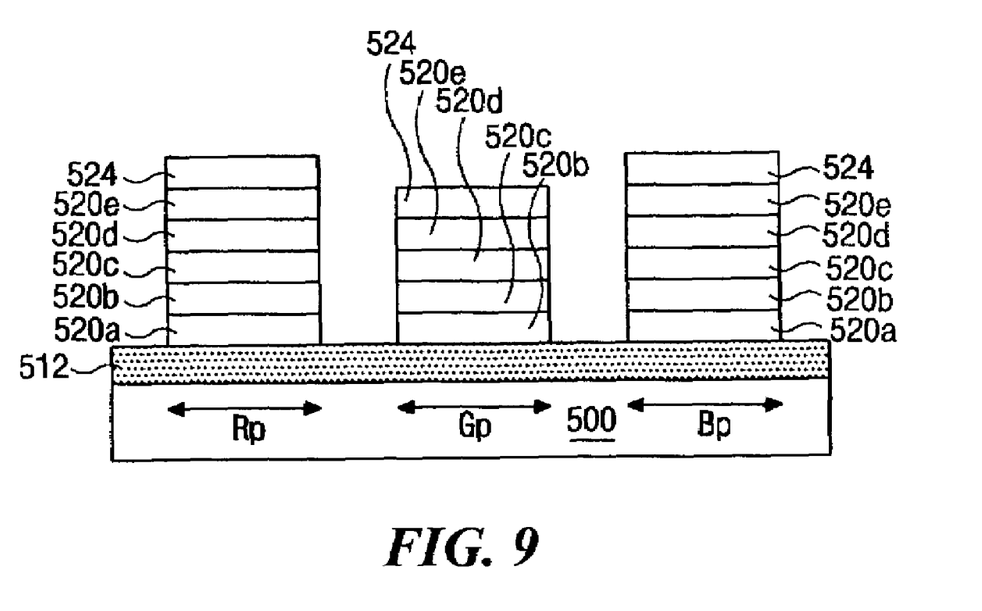
FIG. 9 is a cross-sectional view of another exemplary ELD according to the present invention.

FIG. 9 is a cross-sectional view of another exemplary ELD according to the present invention. In FIG. 9, a first electrode 512 may be formed along a first direction on a substrate 500 having a pixel region (not shown). The pixel region may include a plurality of sub-pixel regions $R_P$ for red (R), $G_P$ for green (G), and $B_P$ for blue (B). A second electrode 524 may be formed over the first electrode 512 along a second direction perpendicular to the first direction. An organic layer 520 including multi-layers may be interposed between the first and second electrodes 512 and 524. The first electrode 512 may include a transparent conductive material having a high work function, such as indium-tin-oxide (ITO) or indium-zinc-oxide (IZO), for example, and the second electrode 524 may include a metallic material having a low work function, such as aluminum (Al), calcium (Ca) or magnesium (Mg), for example. Alternatively, the second electrode 524 may include a double layer structure including lithium fluorine/aluminum (LiF/Al), for example. The first electrode 512 may function as an anode through which a hole is injected into the organic layer 520, wherein the first electrode 512 may be electrically connected to an external circuit (not shown). The second electrode 524 may function as a cathode through which an electron is injected into the organic layer 520, wherein the second electrode 524 may also be electrically connected to the external circuit (not shown).

The organic layer 520 for red and blue may include a hole injection layer (HIL) 520a, a hole transporting layer (HTL) 520b, an emitting material layer (EML) 520c of a phosphorescent material, a hole blocking layer (HBL) 520d, and an electron transporting layer (ETL) 520e. Conversely, the organic layer 520 for green having the EML 220c of a fluorescent material may not include the HBL 520d. The HIL 520a and the HTL 520b may be independently formed for each sub-pixel region $R_P$, $G_P$, and $B_P$ to maximize a luminescent efficiency of the EML 520c. Further, the same material may be used for the ETL 520e of each sub-pixel region $R_P$, $G_P$, and $B_P$. Even though a phosphorescent material may be used for red and blue in the present invention, the phosphorescent material can be used for the other set of two colors.

Figure 10:
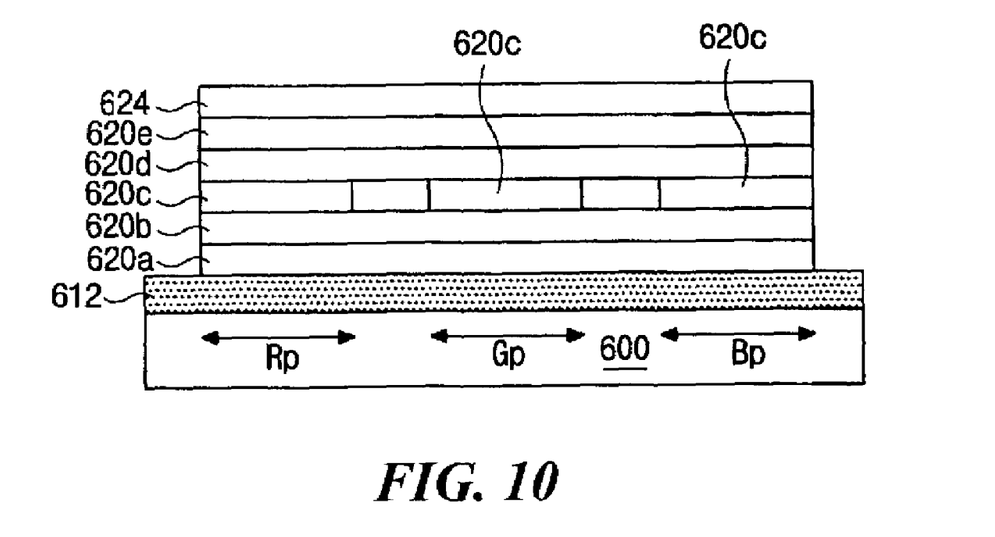
FIG. 10 is a cross-sectional view of another exemplary ELD according to the present invention.

FIG. 10 is a cross-sectional view of another exemplary ELD according to the present invention. In FIG. 10, a first electrode 612 may be formed along a first direction on a substrate 600 having a pixel region (not shown). The pixel region may include a plurality of sub-pixel regions $R_P$ for red (R), $G_P$ for green (G), and $B_P$ for blue (B). A second electrode 624 may be formed over the first electrode 612 along a second direction perpendicular to the first direction. An organic layer 620 including multi-layers may be interposed between the first and second electrodes 612 and 624. The first electrode 612 may include a transparent conductive material having a high work function, such as indium-tin-oxide (ITO) or indium-zinc-oxide (IZO), for example, and the second electrode 624 may include a metallic material having a low work function, such as aluminum (Al), calcium (Ca) or magnesium (Mg), for example. Alternatively, the second electrode 624 may include a double layer structure including lithium fluorine/aluminum (LiF/Al), for example. The first electrode 612 may function as an anode through which a hole is injected into the organic layer 620, wherein the first electrode 612 may be electrically connected to an external circuit (not shown). The second electrode 624 may function as a cathode through which an electron is injected into the organic layer 620, wherein the second electrode 624 may also be electrically connected to the external circuit (not shown).

The organic layer 620 for red, green and blue may include a hole injection layer (HIL) 620a, a hole transporting layer (HTL) 620b, an emitting material layer (EML) 620c, a hole blocking layer (HBL) 620d, and an electron transporting layer (ETL) 620e. The EML 620c may be independently formed at each sub-pixel region $R_P$, $G_P$, and $B_P$ through deposition and patterning of a phosphorescent material, for example.

It will be apparent to those skilled in the art that various modifications and variations can be made in the organic electroluminescent display of the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
    a substrate having a plurality of sub-pixel regions for red, green and blue;
    a driving device on the substrate;
    a first electrode connected to the driving device, a hole being injected from the first electrode;
    a second electrode over the first electrode, an electron being injected from the second electrode; and
    a light emitting material layer interposed between the first and second electrodes within each of the sub-pixel regions, the light emitting material layer within at least one of the plurality of sub-pixel regions includes a fluorescent material and excludes a phosphorescent material and the light emitting material layer within the other ones of the plurality of sub-pixel regions include a phosphorescent material.

2. The device according to claim 1, wherein the first electrode includes one of indium-tin-oxide (ITO) and indium-zinc-oxide (IZO).

3. The device according to claim 1, wherein the second electrode includes one of aluminum (Al), calcium (Ca), and magnesium (Mg).

4. The device according to claim 1, wherein the second electrode includes a double layer structure including lithium fluorine/aluminum (LiF/Al).

5. The device according to claim 1, further comprising a hole injection layer and a hole transporting layer between the first electrode and the light emitting material layer within each of the sub-pixel regions, and an electron transport layer between the second electrode and the light emitting material layer within each of the sub-pixel regions.

6. The device according to claim 5, further comprising a hole blocking layer between the light emitting material layer within the other ones of the plurality of sub-pixel regions having the phosphorescent material and the electron transport layer.

7. The device according to claim 1, wherein each of the sub-pixel regions includes different materials.

8. An organic electroluminescent display device, comprising:
    a substrate;
    a first electrode disposed along a first direction on the substrate, a hole being injected from the first electrode;
    a second electrode disposed along a second direction perpendicular to the first direction over the first electrode, an electron being injected from the second electrode;
    a plurality of sub-pixel regions for red, green and blue disposed at intersections of the first and second electrodes; and
    a light emitting material layer interposed between the first and second electrodes for each of the sub-pixel regions, the light emitting material layer within at least one sub-pixel region includes a fluorescent material and excludes a phosphorescent material and the light emitting material layer within the other ones of the plurality of sub-pixel regions include a phosphorescent material.

9. The device according to claim 8, wherein the first electrode includes one of indium-tin-oxide (ITO) and indium-zinc-oxide (IZO).

10. The device according to claim 8, wherein the second electrode includes one of aluminum (Al), calcium (Ca), and magnesium (Mg).

11. The device according to claim 8, wherein the second electrode includes a double layer structure including lithium fluorine/aluminum (LiF/Al).

12. The device according to claim 8, further comprising a hole injection layer and a hole transporting layer between the first electrode and the light emitting material layer within each of the sub-pixel regions, and an electron transport layer between the second electrode and the light emitting material layer within each of the sub-pixel regions.

13. The device according to claim 12, further comprising a hole blocking layer between the light emitting material layer within the other ones of the plurality of sub-pixel regions having the phosphorescent material and the electron transport layer.

14. A method of fabricating an organic electroluminescent display device, comprising:
    forming a plurality of sub-pixel regions for red, green and blue on a substrate;
    forming a driving device on the substrate;
    forming a first electrode connected to the driving device, a hole being injected from the first electrode;
    forming a second electrode over the first electrode, an electron being injected from the second electrode; and
    forming a light emitting material layer interposed between the first and second electrodes within each of the sub-pixel regions, the light emitting material layer within at least one of the plurality of sub-pixel regions includes a fluorescent material and excludes a phosphorescent material and the light emitting material layer of the other ones of the plurality of sub-pixel regions include a phosphorescent material.

15. The method according to claim 14, wherein the first electrode includes one of indium-tin-oxide (ITO) and indium-zinc-oxide (IZO).

16. The method according to claim 14, wherein the second electrode includes one of aluminum (Al), calcium (Ca), and magnesium (Mg).

17. The method according to claim 14, wherein the second electrode includes a double layer structure including lithium fluorine/aluminum (LiF/Al).

18. The method according to claim 14, further comprising steps of:
    forming a hole injection layer and a hole transporting layer between the first electrode and the light emitting material layer within each of the sub-pixel regions; and
    forming an electron transport layer between the second electrode and the light emitting material layer within each of the sub-pixel regions.

19. The method according to claim 18, further comprising a step of forming a hole blocking layer between the light emitting material layer within the other ones of the plurality of sub-pixel regions having the phosphorescent material and the electron transport layer.

20. The method according to claim 14, wherein each of the sub-pixel regions includes different materials.

21. A method of fabricating an organic electroluminescent display device, comprising:
    forming a first electrode disposed along a first direction on a substrate, a hole being injected from the first electrode;
    forming a second electrode disposed along a second direction perpendicular to the first direction over the first electrode, an electron being injected from the second electrode;
    forming a plurality of sub-pixel regions for red, green and blue disposed at intersections of the first and second electrodes; and forming a light emitting material layer interposed between the first and second electrodes within each of the sub-pixel regions, the light emitting material layer of at least one sub-pixel region includes a fluorescent material and excludes a phosphorescent material and the light emitting material layer of the other ones of the plurality of sub-pixel regions include a phosphorescent material.

22. The method according to claim 21, wherein the first electrode includes one of indium-tin-oxide (ITO) and indium-zinc-oxide (IZO).

23. The method according to claim 21, wherein the second electrode includes one of aluminum (Al), calcium (Ca), and magnesium (Mg).

24. The method according to claim 21, wherein the second electrode includes a double layer structure including lithium fluorine/aluminum (LiF/Al).

25. The method according to claim 21, further comprising steps of:
forming a hole injection layer and a hole transporting layer between the first electrode and the light emitting material layer within each of the sub-pixel regions; and
forming an electron transport layer between the second electrode and the light emitting material layer within each of the sub-pixel regions.

26. The method according to claim 25, further comprising a step of forming a hole blocking layer between the light emitting material layer within the other ones of the plurality of sub-pixel regions having the phosphorescent material and the electron transport layer.

27. The method according to claim 21, wherein each of the sub-pixel regions includes different materials.

* * * * *